US008618545B2

(12) United States Patent
Gosain et al.

(10) Patent No.: US 8,618,545 B2
(45) Date of Patent: Dec. 31, 2013

(54) THIN FILM TRANSISTOR AND DISPLAY

(75) Inventors: Dharam Pal Gosain, Tokyo (JP); Tsutomu Tanaka, Kanagawa (JP); Narihiro Morosawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/400,845

(22) Filed: Feb. 21, 2012

(65) Prior Publication Data

US 2012/0146039 A1      Jun. 14, 2012

Related U.S. Application Data

(63) Continuation of application No. 12/392,153, filed on Feb. 25, 2009, now Pat. No. 8,134,154.

(30) Foreign Application Priority Data

Mar. 13, 2008   (JP) .................................. 2008-063915

(51) Int. Cl.
*H01L 29/04* (2006.01)
*H01L 29/10* (2006.01)
*H01L 31/00* (2006.01)

(52) U.S. Cl.
USPC ............... 257/59; 257/E29.273; 257/E51.005

(58) Field of Classification Search
USPC ....................... 257/E29.282, E29.273, 59, 72, 257/E27.146, E31.121, E31.122, E51.005
See application file for complete search history.

(56) References Cited

U.S. PATENT DOCUMENTS

| 5,781,254 | A  | * | 7/1998  | Kim et al. .................... 349/44 |
| 6,506,617 | B1 | * | 1/2003  | Cheng .......................... 438/22 |
| 6,917,393 | B2 | * | 7/2005  | Sakamoto et al. ............. 349/43 |
| 6,987,311 | B2 | * | 1/2006  | Yang et al. ................... 257/659 |
| 2003/0232456 | A1 | * | 12/2003 | Yang et al. .................. 438/30 |
| 2007/0252147 | A1 | * | 11/2007 | Kim et al. .................... 257/59 |
| 2007/0291217 | A1 | * | 12/2007 | Kang et al. .................. 349/156 |

FOREIGN PATENT DOCUMENTS

| JP | 04-132263  | 5/1992 |
| JP | 05-198809  | 8/1993 |
| JP | 08-032082  | 2/1996 |
| JP | 09-043632  | 2/1997 |
| JP | 2006-190923 | 7/2006 |
| JP | 2007-115902 | 5/2007 |

* cited by examiner

*Primary Examiner* — Daniel Luke
*Assistant Examiner* — Latanya N Crawford
(74) *Attorney, Agent, or Firm* — Dentons US LLP

(57) ABSTRACT

A thin film transistor capable of reliably preventing the entry of light into an active layer, and a display including the thin film transistor are provided. A thin film transistor includes: a gate electrode; an active layer; and a gate insulating film arranged between the gate electrode and the active layer, the gate insulating film including a first insulating film, a first light-absorbing layer and a second insulating film, the first insulating film arranged in contact with the gate electrode, the first light-absorbing layer arranged in contact with the first insulating film and made of a material absorbing light of 420 nm or less, the second insulating film arranged between the first light-absorbing layer and the active layer.

7 Claims, 17 Drawing Sheets

THIN FILM TRANSISTOR AND DISPLAY

RELATED APPLICATION DATA

This application is a continuation of U.S. patent application Ser. No. 12/392,153, filed Feb. 25, 2009, the entirety of which is incorporated herein by reference to the extent permitted by law. This application claims the benefit of priority to Japanese Patent Application No. JP 2008-063915 filed in the Japanese Patent Office on Mar. 13, 2008, the entirely of which is incorporated herein by reference to the extent permitted by law.

BACKGROUND OF THE INVENTION

The present invention relates to a thin film transistor (TFT) including an active layer made of an oxide conductor or silicon (Si), and a display including the thin film transistor.

Thin film transistors have been widely applied as fundamental technology for liquid crystal displays or organic EL (Electro Luminescence) displays. As a typical semiconductor film which is an active layer for the displays, a silicon (Si) film in a noncrystalline state (a so-called amorphous silicon film) or a polysilicon film crystallized by an excimer laser or solid-phase growth is used. Moreover, in recent years, it has been proposed that as a semiconductor film, a metal oxide capable of being formed by a low-cost apparatus such as a sputtering method is used.

In most of thin film transistors using a silicon film for an active layer, a light-shielding film is arranged to prevent light from entering the silicon film. Moreover, it has been known that in a metal oxide semiconductor, a change in electrical conductance occurs due to photoinduction (for example, refer to Japanese Unexamined Patent Application Publication No. 2007-115902 (FIG. 8)), so it has been proposed to arrange a light-shielding film.

SUMMARY OF THE INVENTION

However, as a material of a light-shielding film, a material having electrical conductivity such as a metal or silicon is used, so in terms of influence on characteristics of a thin film transistor, it is difficult to bring a light-shielding film and an active layer sufficiently close to each other, and light may not be sufficiently shielded. Moreover, manufacturing steps are complicated by arranging the light-shielding film.

It is desirable to provide a thin film transistor capable of reliably preventing the entry of light into an active layer, and a display including the thin film transistor.

According to an embodiment of the invention, there is provided a thin film transistor including the following components (A) to (C):

(A) a gate electrode;
(B) an active layer; and
(C) a gate insulating film arranged between the gate electrode and the active layer, the gate insulating film including a first insulating film, a first light-absorbing layer and a second insulating film, the first insulating film arranged in contact with the gate electrode, the first light-absorbing layer arranged in contact with the first insulating film and made of a material absorbing light of 420 nm or less, the second insulating film arranged between the first light-absorbing layer and the active layer.

According to an embodiment of the invention, there is provided a display including: a thin film transistor and a display device on a substrate, in which the thin film transistor is composed of the thin film transistor according to the above-described embodiment of the invention.

In the thin film transistor according to the embodiment of the invention, the gate insulating film includes the first insulating film arranged in contact with the gate electrode, and the first light-absorbing layer arranged in contact with the first insulating film and made of the material absorbing light of 420 nm or less and the second insulating film arranged between the first light-absorbing layer and the active layer, so a distance between the first light-absorbing layer and the active layer becomes extremely small, and the entry of light into the active layer is reliably prevented, and characteristics are stabilized. Therefore, in the display including the thin film transistor, for example, in a liquid crystal display, leakage of an electric charge in a liquid crystal storing period is prevented, and degradation in display quality such as contrast or luminance is prevented.

In the thin film transistor according to the embodiment of the invention, the gate insulating film includes the first insulating film arranged in contact with the gate electrode, the first light-absorbing layer arranged in contact with the first insulating film and made of the material absorbing light of 420 nm or less and the second insulating film arranged between the first light-absorbing layer and the active layer, so the distance between the first light-absorbing layer and the active layer is able to become extremely small, and the entry of light into the active layer is able to be reliably prevented.

In the display according to the embodiment of the invention, the thin film transistor with stabilized characteristics according to the embodiment of the invention is included, so high display quality is able to be achieved.

Other and further objects, features and advantages of the invention will appear more fully from the following description.

BRIEF DESCRIPTION OF THE DRAWINGS

FIGS. 20A and 20B are a front view and a side view in a state in which the application example 5 is opened, respectively, and FIGS. 20C, 20D, 20E, 20F and 20G are a front view, a left side view, a right side view, a top view and a bottom view in a state in which the application example 5 is closed, respectively.

DETAILED DESCRIPTION OF THE PREFERRED EMBODIMENTS

Preferred embodiments will be described in detail below referring to the accompanying drawings.

First Embodiment

Figure 1:
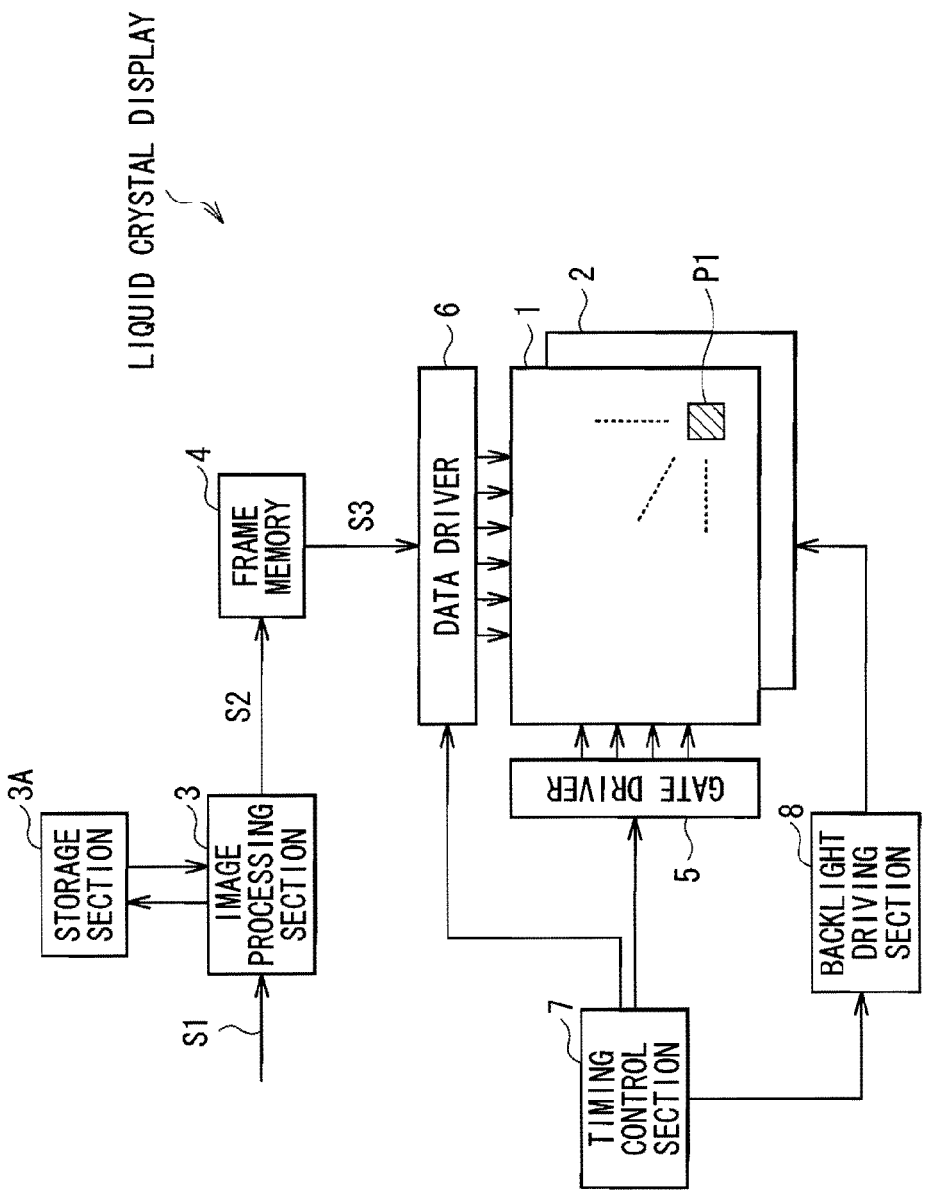
FIG. 1 is an illustration of the whole configuration of a liquid crystal display including a liquid crystal display panel according to a first embodiment of the invention.

FIG. 1 illustrates the configuration of a liquid crystal display according to a first embodiment of the invention. The liquid crystal display is used for a liquid crystal television or the like, and the liquid crystal display includes, for example, a liquid crystal display panel 1, a backlight section 2, an image processing section 3, a frame memory 4, a gate driver 5, a data driver 6, a timing control section 7 and a backlight driving section 8.

The liquid crystal display panel 1 displays a picture on the basis of a picture signal Di transmitted from the data driver 6 in response to a driving signal supplied from the gate driver 5. The liquid crystal display panel 1 includes a plurality of pixels P1 arranged in a matrix form, and is an active matrix liquid crystal display panel in which each pixel P1 is driven individually. Each pixel P1 is composed of, for example, a liquid crystal display device, and displays any one of basic colors, that is, red (R), green (G) and blue (B).

The backlight section 2 is a light source applying light to the liquid crystal display panel 1, and includes, for example, a CCFL (Cold Cathode Fluorescent Lamp), an LED (Light Emitting Diode) or the like.

The image processing section 3 performs predetermined image processing on a picture signal S1 from outside through the use of a storage section 3A to produce a picture signal S2 which is an RGB signal.

The frame memory 4 stores the picture signal S2 supplied from the image processing section 3 for each pixel P in a frame.

The timing control section 7 controls the timing of driving the gate driver 5, the data driver 6 and the backlight driving section 8. Moreover, the backlight driving section 8 controls the illumination operation of the backlight section 2 according to the timing control of the timing control section 7.

Figure 2:
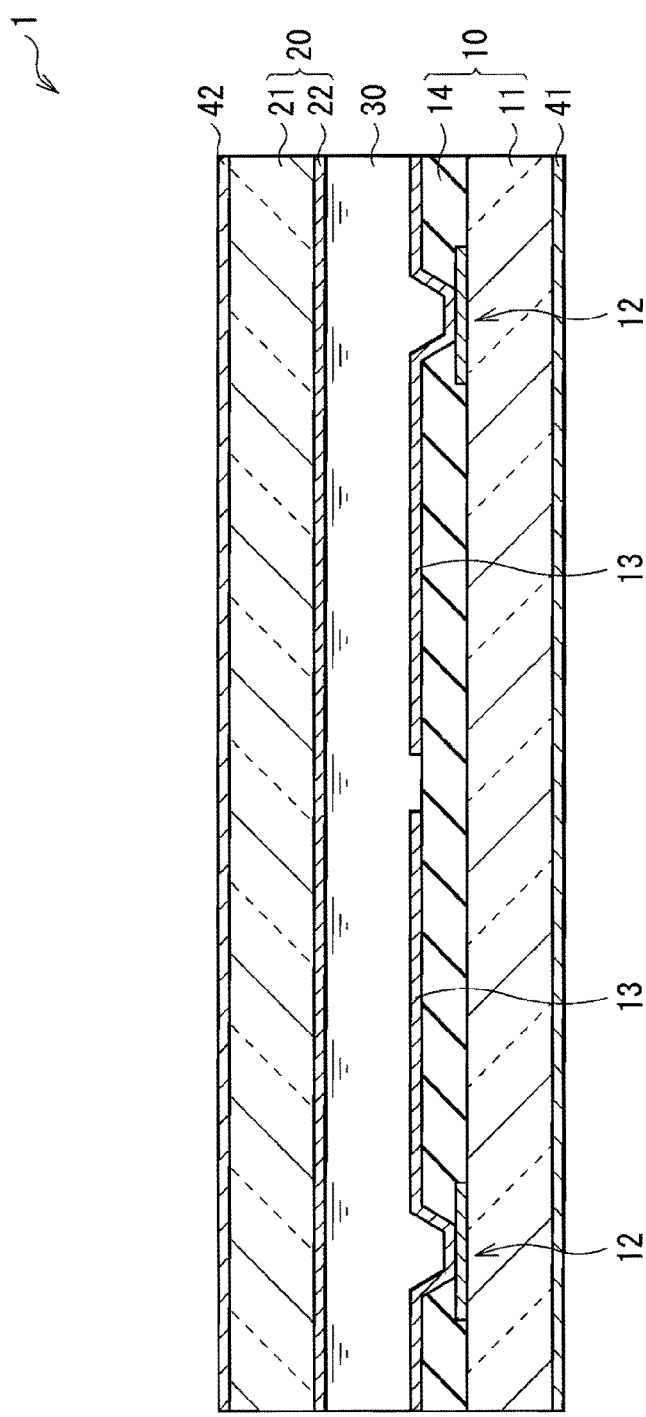
FIG. 2 is a sectional view of a configuration of a part of the liquid crystal display panel illustrated in FIG. 1.

FIG. 2 illustrates a sectional configuration of the liquid crystal display panel 1. The liquid crystal display panel 1 includes a liquid crystal layer 30 between a TFT substrate (a drive substrate) 10 and a facing substrate 20. Polarizing plates 41 and 42 are arranged on the TFT substrate 10 and the facing substrate 20, respectively, so that optical axes (not illustrated) of the polarizing plates 41 and 42 are orthogonal to each other.

In the TFT substrate 10, a TFT 12 and a pixel electrode 13 made of ITO (Indium Tin Oxide) or the like are formed in each pixel P1 on a glass substrate 11. An interlayer insulating film 14 is arranged between the TFT 12 and the pixel electrode 13. The pixel electrode 13 is electrically connected to the TFT 12 via a connection hole 14A arranged in the interlayer insulating film 14. In the glass substrate 11, a capacitive element (not illustrated) or the like is arranged.

The facing substrate 20 is formed by forming a common electrode 22 made of ITO on a glass substrate 21. On the glass substrate 21, a color filter and a black matrix or the like (not illustrated) are formed.

Figure 3:
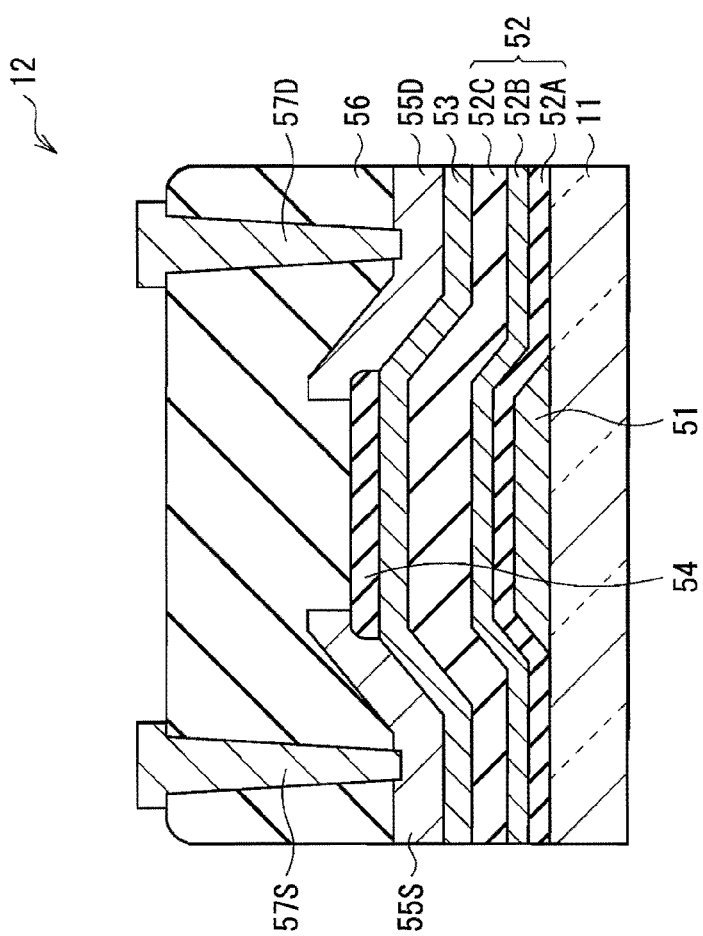
FIG. 3 is a sectional view of a configuration of a TFT illustrated in FIG. 2.

FIG. 3 illustrates an example of the TFT 12. The TFT 12 is formed, for example, by laminating a gate electrode 51, a gate insulating film 52, an active layer 53, a stopper layer 54, a source electrode 55S and a drain electrode 55D, an interlayer insulating film 56, and source wiring 57S and drain wiring 57D in order on the glass substrate 11.

The gate electrode 51 has a thickness of, for example, 65 nm, and is made of molybdenum (Mo). The active layer 53 has a thickness of, for example, 50 nm, and is made of an oxide semiconductor such as an IGZO (InGaZnO)-based, InZnO-based, ZnO-based, SbSnO-based, SrTiO$_3$-based or TiO$_2$-based oxide semiconductor.

The gate insulating film 52 is arranged between the gate electrode 51 and the active layer 53, and includes a first insulating film 52A made of silicon nitride (SiN), a first light-absorbing layer 52B, and a second insulating film 53B made of silicon dioxide (SiO$_2$) in order from the gate electrode 51. The first light-absorbing layer 52B is made of a material absorbing light of 420 nm or less. Thereby, in the TFT 12, the entry of light into the active layer 53 is able to be reliably prevented.

Figure 4:
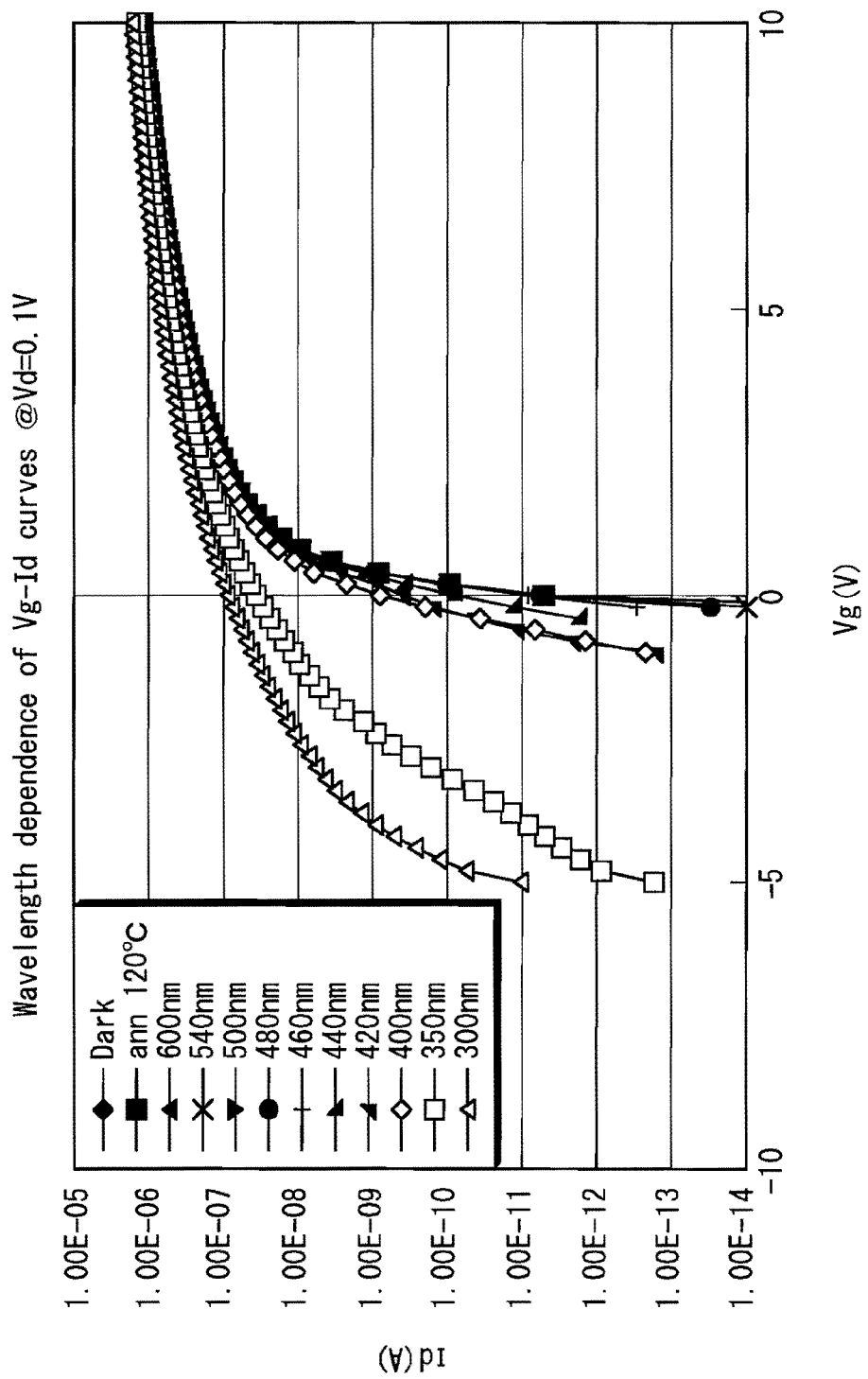
FIG. 4 is an illustration for describing changes in characteristics of the TFT by light.

FIG. 4 illustrates results obtained by examining changes in characteristics of a TFT including an active layer made of IGZO by changing the wavelength of light applied to the TFT. It is obvious from FIG. 4 that when light of 420 nm or less, particularly light of 350 nm or less, is applied, a threshold voltage is largely shifted to the left, and the state of the TFT is the same as the state in which the TFT is constantly on. In Japanese Unexamined Patent Application Publication No. 2007-115902, it is described that a change in the electrical conductance of an oxide semiconductor occurs by photoinduction; however, only an increase in off current is expected from the change. A large shift of the threshold voltage as illustrated in FIG. 4 was first discovered by the inventors of this invention.

More specifically, the first light-absorbing layer 52B is preferably made of amorphous silicon. It is because unlike a metal film, the first light-absorbing layer 52B does not need perfect light shielding properties, and it is only necessary for the first light-absorbing layer 52B to prevent the entry of light of 420 nm or less into the active layer 53. Moreover, there is an advantage that the first insulating film 52A, the first light-absorbing layer 52B and the second insulating film 52C are able to be formed successively, so it is not necessary to increase the number of manufacturing steps.

Figure 5:
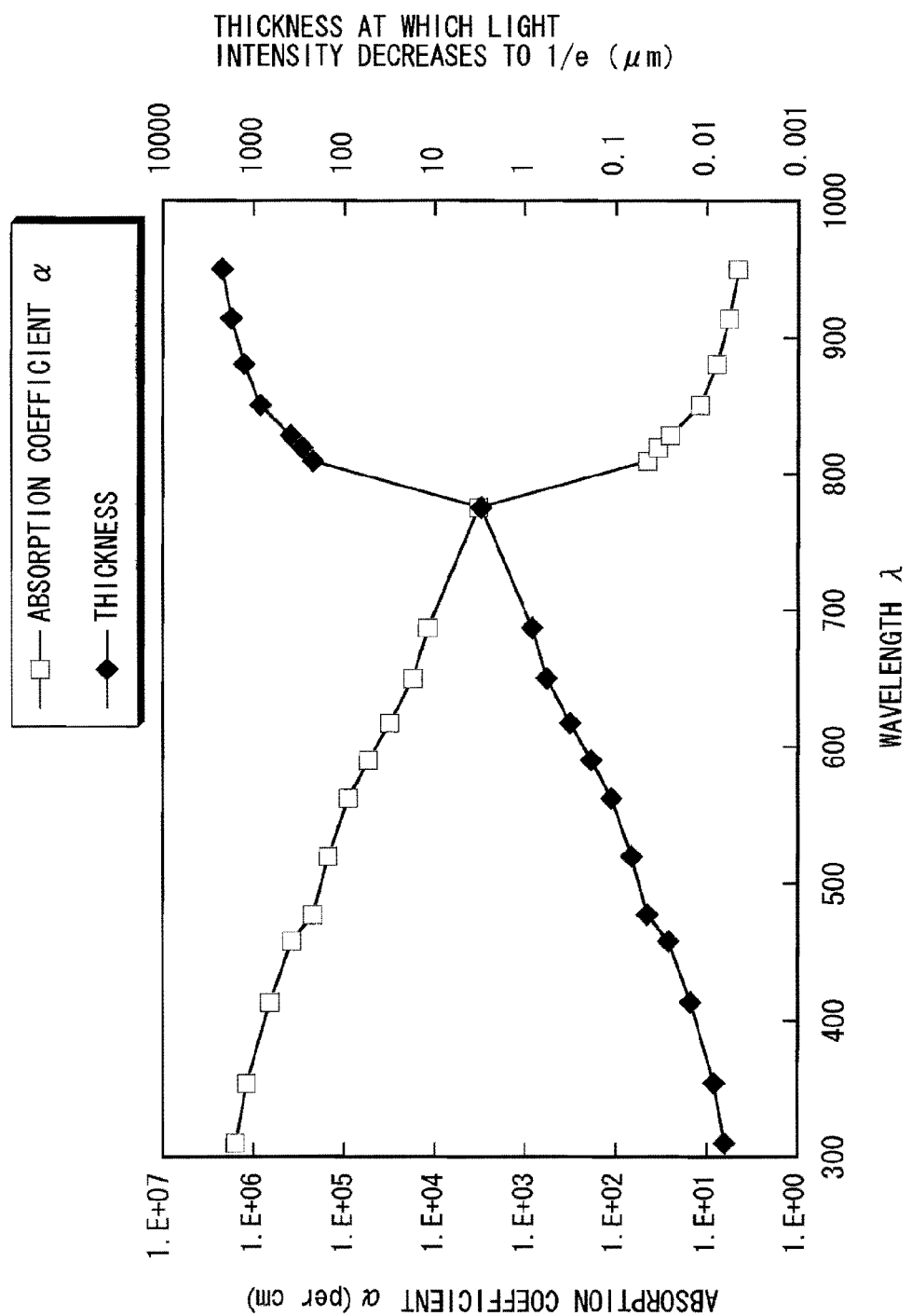
FIG. 5 is an illustration for describing the thickness of a light-absorbing layer.

The thickness of the first light-absorbing layer 52B is preferably within a range from 10 nm to 100 nm both inclusive. It is obvious from FIG. 5 that in a wavelength range of 420 nm or less, a sufficiently high absorption coefficient is obtained when the thickness of the first light-absorbing layer 52B is within the range, for example, approximately 50 nm.

Figure 6:
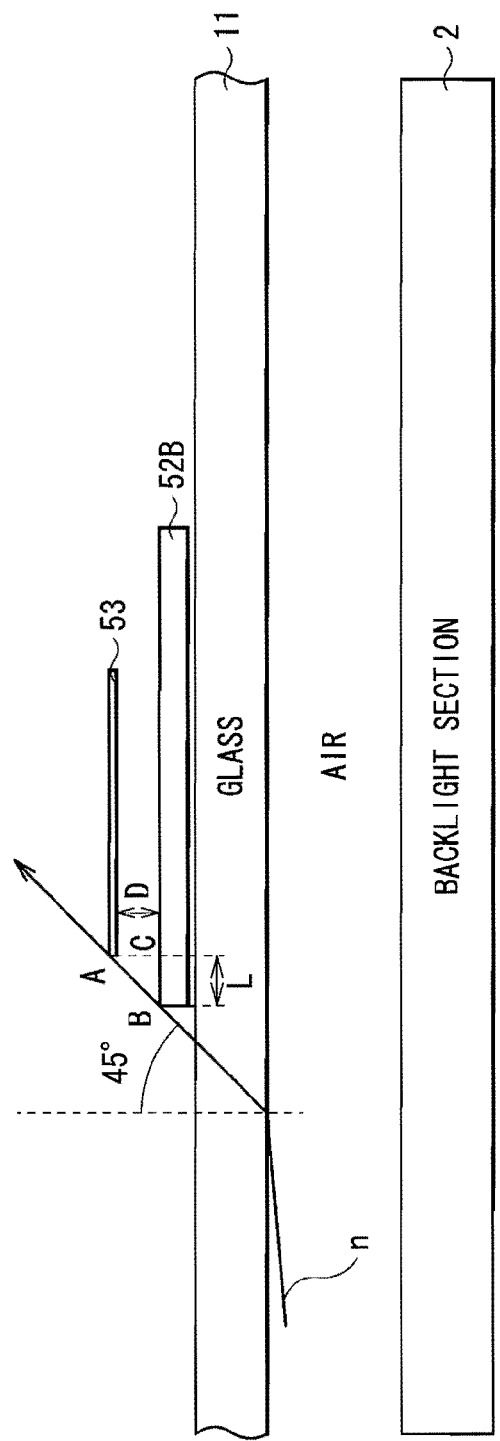
FIG. 6 is an illustration for describing a distance between a first light-absorbing layer and an active layer.

FIG. 6 is an illustration for describing a positional relationship between the first light-absorbing layer 52B and the active layer 53. A distance D between the first light-absorbing layer 52B and the active layer 53 is preferably equal to a distance L between an end (a point A) of the active layer 53 and an end (a point B) of the first light-absorbing layer 52B (D=L). In other words, light entering from the backlight section 2 into the active layer 53 the most easily is light n enter from a side into the active layer 53. The light n enters at 45° in an interface between air and the glass substrate 11. A perpendicular line is drawn from the end (the point A) of the active layer 53 to the first light-absorbing layer 52B to form a triangle ABC. To shield the light n, in the triangle ABC, tan θ=D/L, that is, tan 45°=D/L=1, thereby D=L is derived. When the first light-absorbing layer 52B is formed in the gate insulating film 52, the distance L is able to be reduced. On the other hand, for example, in the case where a light-shielding film is arranged, for example, on a back surface of the glass substrate 11, the distance D is increased, thereby it is necessary to increase the distance L accordingly, so an aperture ratio may be reduced. On the other hand, when the distance L is reduced, the light n entering from the side may not be able to be absorbed by the first light-absorbing layer 52B.

The stopper layer 54 illustrated in FIG. 3 has a thickness of, for example, 20 nm, and is made of silicon dioxide ($SiO_2$). The source electrode 55S and the drain electrode 55D each have a thickness of, for example, 65 nm, and are made of molybdenum (Mo). The interlayer insulating film 56 is made of, for example, silicon nitride (SiN)/silicon dioxide ($SiO_2$). The source wiring 57S and the drain wiring 57D each are made of, for example, titanium (Ti)/aluminum (Al)/titanium (Ti), and are connected to the source electrode 55S and the drain electrode 55D, respectively, through the interlayer insulating film 56.

The liquid crystal display is able to be manufactured by, for example. the following manufacturing method.

Figure 7A:
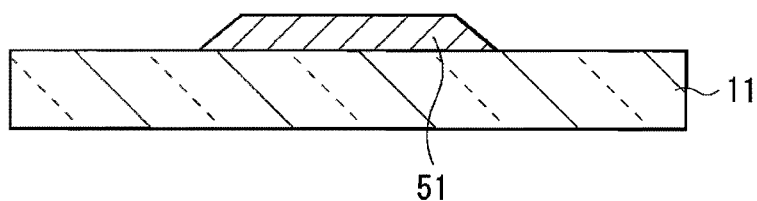
FIGS. 7A, 7B and 7C are sectional views illustrating a method of manufacturing the TFT illustrated in FIG. 3 in order of steps.

At first, as illustrated in FIG. 7A, the gate electrode 51 made of the above-described material with the above-described thickness is formed on the glass substrate 11 by, for example, sputtering.

Figure 7B:
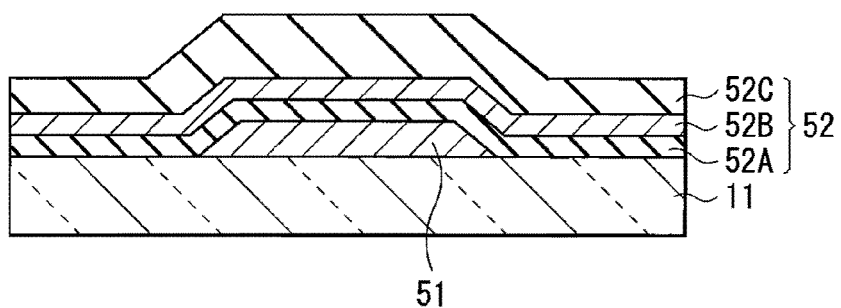

Next, as illustrated in FIG. 7B, the first insulating film 52A, the first light-absorbing layer 52B and the second insulating film 52C which are made of the above-described materials with the above-described thicknesses are successively formed on the gate electrode 51 by, for example, PECVD (Plasma Enhanced Chemical Vapor Deposition). More specifically, the first insulating film 52A made of silicon nitride (SiN) is formed. Next, the first light-absorbing layer 52B made of amorphous silicon is formed by stopping supplying material gases except of silane, and flowing only silane. After that, the supply of the material gases except for silane is initiated to form the second insulating film 53B made of silicon dioxide ($SiO_2$). Thereby, without increasing the number of manufacturing steps and without the need for changing conditions, the gate insulating film 52 including the first insulating film 52A, the first light-absorbing layer 52B and the second insulating film 52C is able to be formed by simple steps. Moreover, unlike the case where a light-shielding film is arranged on the back side of the glass substrate 11, there is little possibility that the front side of the glass substrate 11 is soiled, and cleaning is not necessary, and it is extremely suitable for mass production.

Figure 7C:
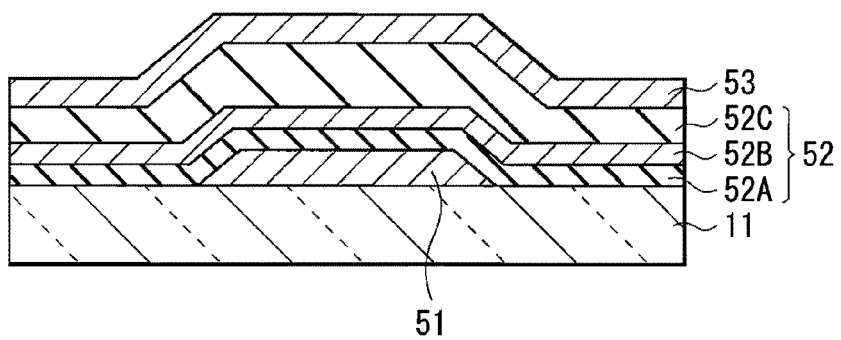
Figure 8A:
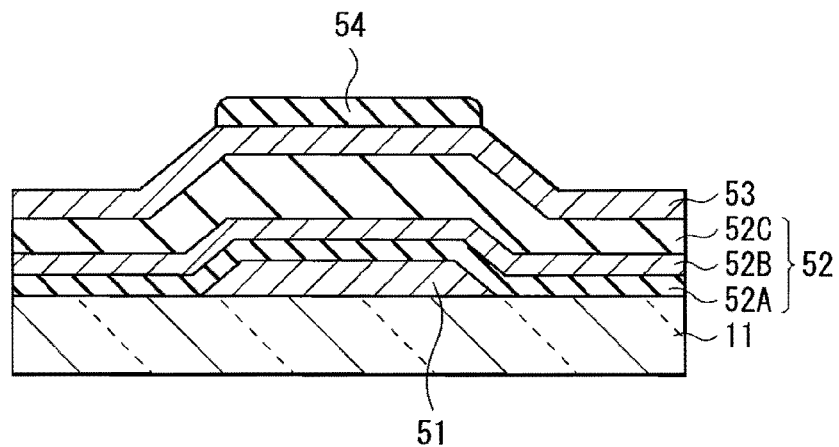
FIGS. 8A and 8B are sectional views illustrating steps following FIGS. 7A, 7B and 7C.
Figure 8B:
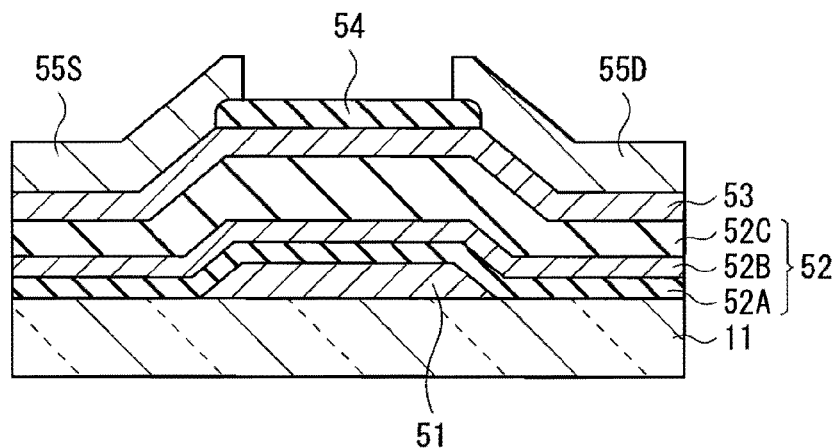

Next, as illustrated in FIG. 7C, the active layer 53 made of the above-described material with the above-described thickness is formed by, for example, sputtering. After that, as illustrated in FIG. 8A, the stopper layer 54 made of the above-described material is formed above the gate electrode 51, and as illustrated in FIG. 8B, the source electrode 55S and the drain electrode 55D made of the above-described material are formed.

After the source electrode 55S and the drain electrode 55D are formed, the interlayer insulating film 56 made of the above-described material is formed, and through holes are formed in the interlayer insulating film 56, and then the source wiring 57S and the drain wiring 57D made of the above-described material are formed. Thereby, the TFT 12 illustrated in FIG. 3 is formed.

Figure 9:
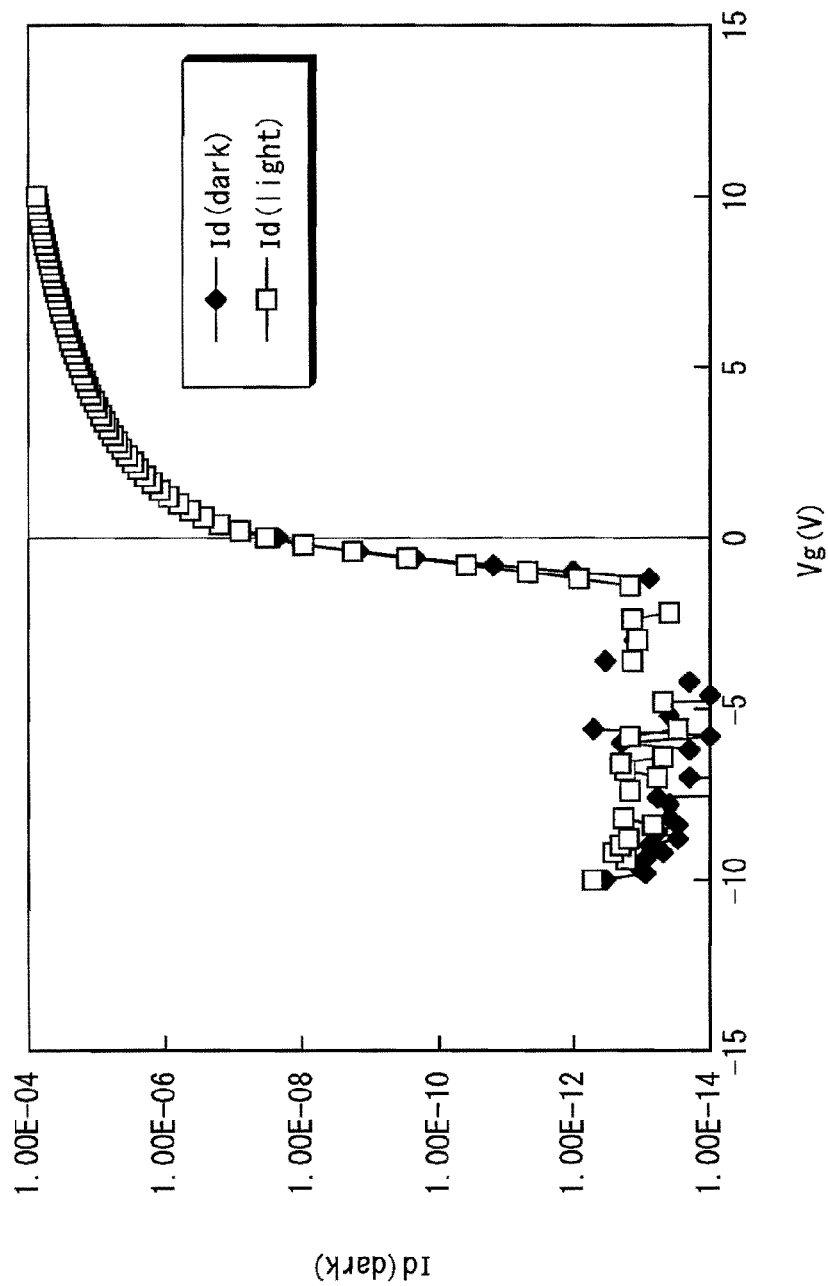
FIG. 9 illustrates changes in characteristics in the case where light is applied and in the case where light is not applied.

When the TFT was actually formed by the manufacturing method, and light as backlight was applied from the back surface of the obtained TFT, as illustrated in FIG. 9, compared to the case where the light was not applied, a change in characteristics was not observed. In other words, it was confirmed that when the first light-absorbing layer was arranged, the entry of light into the active layer was prevented, and characteristics were able to be stabilized.

After the TFT 12 is formed, the interlayer insulating film 14 is formed, and a connection hole is arranged by patterning. Next, the pixel electrode 13 is formed, and patterning is performed so as to form a predetermined shape. Thereby, the drive substrate 10 is formed.

Moreover, the common electrode 22 is formed on the glass substrate 21 by a normal manufacturing method so as to form the facing substrate 20.

After the drive substrate 10 and the facing substrate 20 are formed, they are arranged to face each other, and a sealing layer (not illustrated) is formed around them, and a liquid crystal is injected into the inside of the sealing layer to form the liquid crystal layer 30. Thereby, the liquid crystal display panel 1 illustrated in FIGS. 2 and 3 is formed. The liquid crystal display panel 1 is incorporated in a system including the backlight section 2, the image processing section 3, the frame memory 4, the gate driver 5, the data driver 6, the timing control section 7 and the backlight driving section 8 so as to complete the liquid crystal display according to the embodiment.

In the liquid crystal display panel 1, as illustrated in FIG. 1, the image processing section 3 performs image processing on the picture signal S1 supplied from outside so as to produce the picture signal S2 for each pixel P1. The picture signal S2 is stored in the frame memory 4, and the picture signal S2 is supplied to the data driver 6 as the picture signal S3. On the basis of the picture signal S3 supplied in such a manner, line-sequential display driving operation is performed in each pixel P1 by a driving voltage outputted from the gate driver 5 and the data driver 6 to each pixel P1. Thereby, illumination light from the backlight section 2 is modulated by the liquid crystal display panel 1 to be outputted as display light.

In this case, the gate insulating film 52 includes the first insulating film 52A, the first light-absorbing layer 52B made of the material absorbing light of 420 nm or less, and the second insulating film 52C, so the distance D between the first light-absorbing layer 52B and the active layer 53 becomes extremely small, and the entry of light into the active layer 53 is reliably prevented, and the characteristics are stabilized. Therefore, leakage of an electric charge in a liquid crystal storing period is prevented, and degradation in display quality such as contrast or luminance is prevented.

Thus, in the embodiment, the gate insulating film 52 of the TFT 12 includes the first insulating film 52A, the first light-absorbing layer 52B made of the material absorbing light of 420 nm or less, and the second insulating film 52C, so the distance D between the first light-absorbing layer 52B and the active layer 53 is able to become extremely small, and the entry of light into the active layer 53 is able to be reliably prevented. Therefore, when a display using the TFT 12 is configured, high display quality is able to be achieved, because the characteristics of the TFT 12 are stabilized.

Second Embodiment

Figure 10:
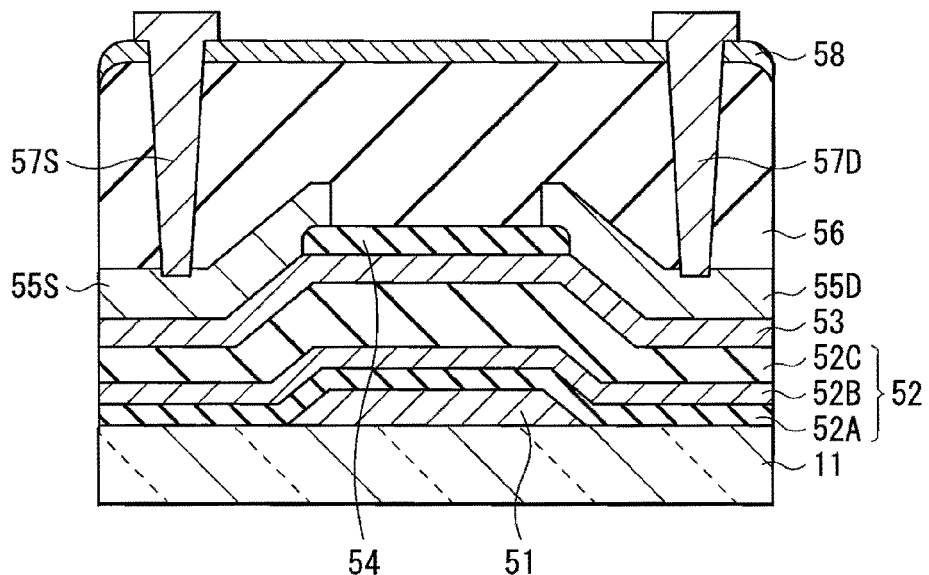
FIG. 10 is a sectional view of a configuration of a TFT according to a second embodiment of the invention.

FIG. 10 illustrates the configuration of a TFT according to a second embodiment of the invention. The TFT has the same configuration as that of the TFT 12 described in the first embodiment, except that a second light-absorbing layer 58 is arranged on the interlayer insulating film 56.

Figure 11:
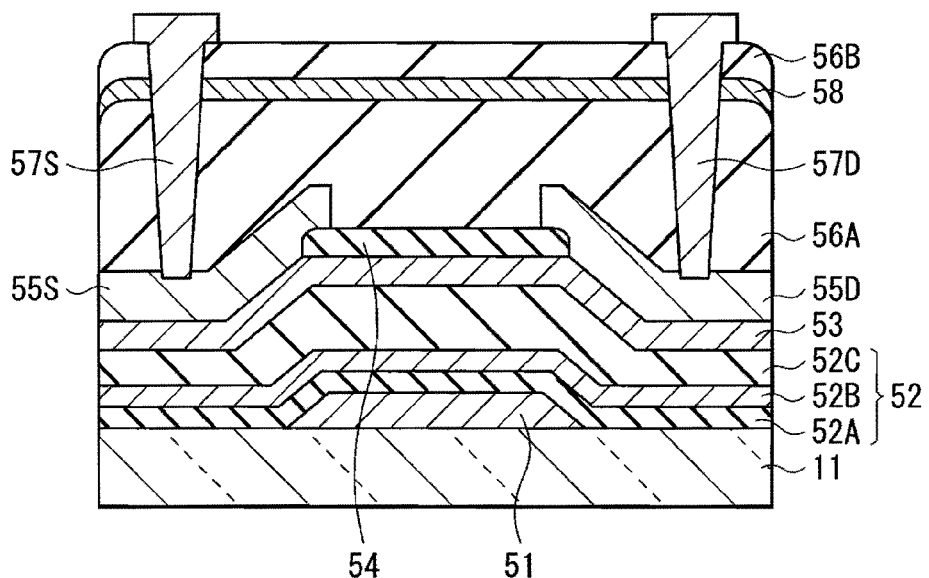
FIG. 11 is a sectional view of a modification of the TFT illustrated in FIG. 10.

The second light-absorbing layer 58 prevents light from above from entering the active layer 53. The material and the thickness of the second light-absorbing layer 58 are the same as those of the first light-absorbing layer 52B. Moreover, as illustrated in FIG. 11, the second light-absorbing layer 58 may be arranged between two interlayer insulating films 56A and 56B.

Third Embodiment

Figure 12:
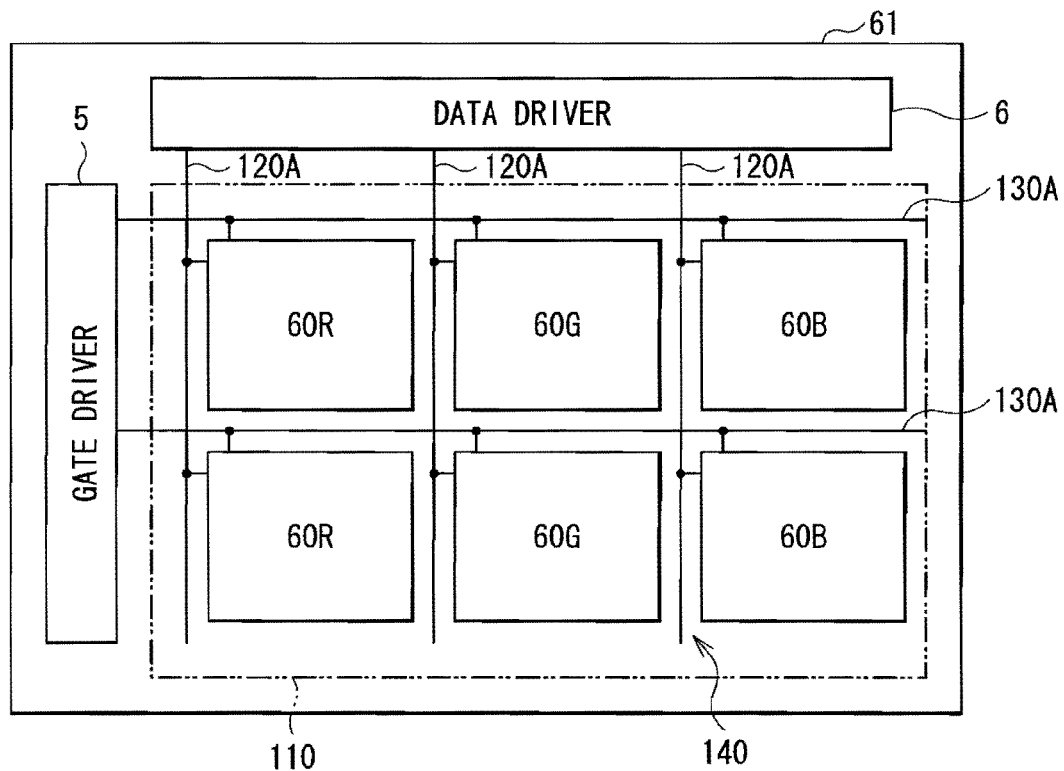
FIG. 12 is an illustration of a configuration of a display according to a third embodiment of the invention.

FIG. 12 illustrates an example of a configuration in which the foregoing respective embodiments of the invention are applied to an organic light-emitting display (an organic EL display). A third embodiment is the same as the first embodiment, except that a display device is composed of an organic light-emitting device, and the functions and effects of the third embodiment are the same as those in the first embodiment. Therefore, like component are denoted by like numerals.

The display is used as a ultra-thin organic light-emitting color display or the like, and in the display, a display region 110 where a plurality of organic light-emitting devices 60R, 60G and 60B which will be described later as display devices are arranged in a matrix form on, for example, a TFT substrate 61 is formed, and a data driver 6 and a gate driver 5 as drivers for picture display are formed around the display region 110.

Figure 13:
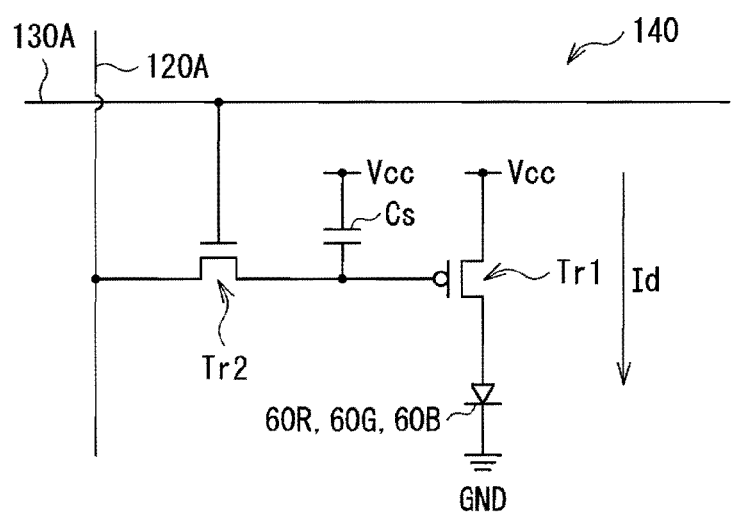
FIG. 13 is an equivalent circuit diagram of an example of a pixel drive circuit illustrated in FIG. 12.

A pixel drive circuit 140 is formed in the display region 110. FIG. 13 illustrates an example of the pixel drive circuit 140. The pixel drive circuit 140 is formed in a layer lower than a first electrode 71 which will be described later, and the pixel drive circuit 140 is an active drive circuit including a driving transistor Tr1 and a writing transistor Tr2, a capacitor (retention capacitor) Cs between the driving transistor Tr1 an the writing transistor Tr2, an organic light-emitting device 10R (or 10G or 10B) connected to the driving transistor Tr1 in series between a first power source line (Vcc) and a second power source line (GND). The driving transistor Tr1 and the writing transistor Tr2 each are composed of the TFT 12 described in the first embodiment or the second embodiment. In particular, in the TFT 12 illustrated in FIG. 10 or FIG. 11 in the second embodiment, the second light-absorbing layer 58 is able to prevent light emitted from the organic light-emitting devices 60R, 60G and 60B from entering the active layer 53 from above.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a subpixel) of the organic light-emitting devices 60R, 60G and 60B. Each signal line 120A is connected to the data driver 6, and an image signal is supplied from the data driver 6 to a source electrode of the writing transistor Tr2 through the signal line 120A. Each scanning line 130A is connected to the gate driver 5, and a scanning signal is sequentially supplied from the gate driver 5 to a gate electrode of the writing transistor Tr2 through the scanning line 130A.

Figure 14:
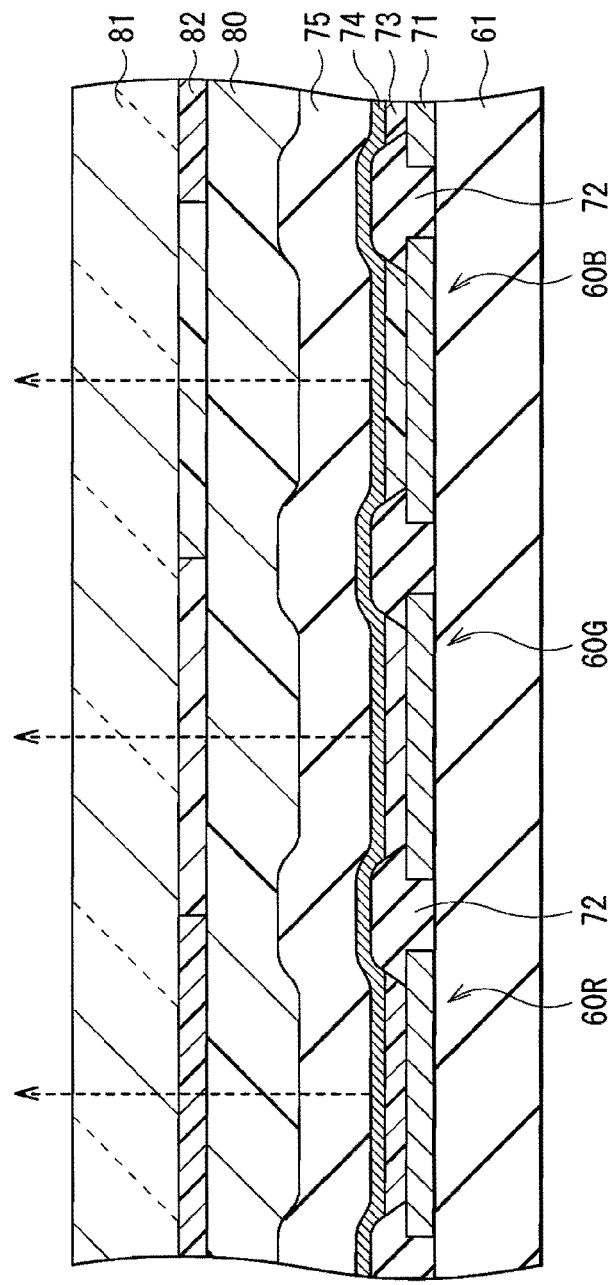
FIG. 14 is a sectional view of a configuration of a display region illustrated in FIG. 12.

FIG. 14 illustrates a sectional view of the display region 110. In the display region 110, the organic light-emitting device 60R emitting red light, the organic light-emitting device 60G emitting green light and the organic light-emitting device 60B emitting blue light are formed in order in a matrix form as a whole. The organic light-emitting devices 60R, 60G and 60B each have a planar strip shape, and a combination of adjacent organic light-emitting devices 60R, 60G and 60B constitutes one pixel.

The organic light-emitting devices 60R, 60G and 60B each have a configuration in which the first electrode 71 as an anode, an interelectrode insulating film 72, an organic layer 73 including a light-emitting layer which will be described later, and the second electrode 74 as a cathode are laminated in this order on the TFT substrate 61.

If necessary, such organic light-emitting devices 60R, 60G and 60B are covered with a protective film 75 made of silicon nitride (SiN), silicon oxide (SiO) or the like, and a sealing substrate 81 made of glass or the like is thoroughly bonded to the protective film 65 with an adhesive layer 80 made of a thermosetting resin, an ultraviolet curable resin or the like in between so as to seal the organic light-emitting devices 60R, 60G and 60B. If necessary, a color filter 82 and a light-shielding film (not illustrated) as a black matrix may be arranged on the sealing substrate 81.

The first electrode 71 is formed corresponding to each of the organic light-emitting devices 60R, 60G and 60B. Moreover, the first electrode 71 has a function as a reflective electrode reflecting light emitted from the light-emitting layer, and it is desirable that the first electrode 71 have as high reflectivity as possible so as to improve light emission efficiency. The first electrode 71 has, for example, a thickness of 100 nm to 1000 nm both inclusive, and is made of a simple substrate or an alloy of a metal element such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt) or gold (Au).

The interelectrode insulating film 72 is provided to secure insulation between the first electrode 71 and the second electrode 74 and to accurately have a desired shape of a light emission region, and is made of, for example, an organic material such as polyimide or an inorganic insulating material such as silicon oxide ($SiO_2$). The interelectrode insulating film 72 has an aperture section corresponding to the light emission region of the first electrode 71. The organic layer 73 and the second electrode 74 may be successively arranged on not only the light emission region but also the interelectrode insulating film 72; however, light is emitted only from the aperture section of the interelectrode insulating film 72.

The organic layer 73 has, for example, a configuration in which a hole injection layer, a hole transport layer, a light-emitting layer and an electron transport layer (all of which are not illustrated) are laminated in order from the first electrode 71 side; however, any of these layers except for the light-emitting layer may be arranged if necessary. Moreover, the organic layer 73 may have a different configuration depending on the color of light emitted from the organic light-emitting devices 60R, 60G or 60B. The hole injection layer is provided to enhance hole injection efficiency, and is a buffer layer for preventing leakage. The hole transport layer is provided to enhance the hole transport efficiency to the light-emitting layer. The light-emitting layer emits light by the recombination of electrons and holes in response to the application of an electric field. The electron transport layer is provided to enhance electron transport efficiency to the light-emitting layer. The material of the organic layer 73 may be a typical low-polymer or high-polymer organic material, and is not specifically limited.

The second electrode 74 has, for example, a thickness of 5 nm to 50 nm both inclusive, and is made of a simple substrate or an alloy of a metal element such as aluminum (Al), magnesium (Mg), calcium (Ca) or sodium (Na). Among them, the second electrode 74 is preferably made of an alloy of magnesium and silver (an MgAg alloy) or an alloy of aluminum (Al) and lithium (Li) (an AlLi alloy). Moreover, the second electrode 74 may be made of ITO (indium-tin complex oxide) or IZO (indium-zinc complex oxide).

The display is able to be manufactured by the following steps, for example.

At first, as in the case of the first embodiment, the TFT 12 is formed on the glass substrate, and the pixel drive circuit 140 is formed by a normal manufacturing method to form the TFT substrate 61.

After the TFT substrate 61 is formed, the first electrode 71 made of the above-described material is formed by, for example, DC sputtering, and the first electrode 71 is selectively etched through the use of, for example, a lithography technique to be patterned into a predetermined shape. Next, the interelectrode insulating film 72 made of the above-described material with the above-described thickness is formed by, for example, a CVD method, and the aperture section is formed through the use of, for example, a lithography technique. After that, the organic layer 73 and the second electrode 74 which are made of the above-described materials are formed in order by, for example, an evaporation method, and the organic light-emitting devices 10R, 10G and 10B are formed. Next, the organic light-emitting devices 10R, 10G and 10B are covered with the protective film 75 made of the above-described material.

After that, the adhesive layer 80 is formed on the protective film 75. After that, the color filter 82 is arranged, and the sealing substrate 81 made of the above-described material is prepared, and the TFT substrate 61 and the sealing substrate 81 are bonded together with the adhesive layer 80 in between. Thereby, the display illustrated in FIGS. 12 to 14 is completed.

In the display, a scanning signal is supplied from the gate driver 5 to each pixel through the gate electrode of the writing transistor Tr2, and an image signal is stored from the data driver 6 into the retention capacitor Cs through the writing transistor Tr2. In other words, the on-off operation of the driving transistor Tr1 is controlled in response to the signal stored in the retention capacitor Cs, thereby a drive current Id is injected into each of the organic light-emitting devices 60R, 60G and 60B to cause recombination of holes and electrons, and then light is emitted. The light passes through the second electrode 74, the protective film 75 and the sealing substrate 81 to be extracted. In this case, as in the case of the first embodiment, the gate insulating film 52 includes the first insulating film 52A, the first light-absorbing layer 52B made of the material absorbing light of 420 nm or less, and the second insulating film 52C, so the distance D between the first light-absorbing layer 52B and the active layer 53 becomes extremely small, and the entry of light into the active layer 53 is reliably prevented, and characteristics are stabilized. Therefore, the operation of the TFT 12 is stabilized, and the display quality is improved.

Thus, in the embodiment, as in the case of the first embodiment, the gate insulating film 52 of the TFT 12 includes the first insulating film 52A, the first light-absorbing layer 52B made of the material absorbing light of 420 nm or less and the second insulating film 52C, so the distance D between the first light-absorbing layer 52B and the active layer 53 is able to become extremely small, and the entry of light into the active layer 53 is able to be reliably prevented. Therefore, when the display is configured using the TFT 12, the characteristics of the TFT 12 are stable, and high display quality is able to be achieved.

MODULE AND APPLICATION EXAMPLES

Application examples of the display described in the foregoing respective embodiments will be described below. The display according to the foregoing respective embodiments is applicable to displays of electronic devices displaying a picture signal inputted from outside or a picture signal produced inside as an image or a picture in any fields, such as televisions, digital cameras, notebook personal computers, portable terminal devices such as cellular phones, and video cameras.

Module

Figure 15:
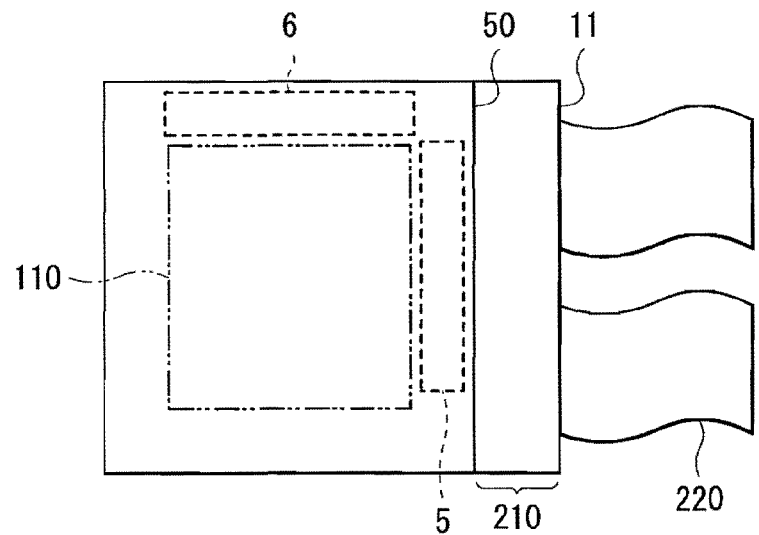
FIG. 15 is a plan view of a schematic configuration of a module including the display according to the foregoing respective embodiments.

The display according to the foregoing respective embodiments is incorporated into various electronic devices such as first to fifth application examples which will be described later as a module as illustrated in FIG. 15. In the module, for example, a region 210 exposed from the sealing substrate 81 and the adhesive layer 80 is arranged on a side of the substrate 11, and an external connection terminal (not illustrated) is formed in the exposed region 210 by extending the wiring of the data driver 6 and the wiring of the gate driver 5. In the external connection terminal, a flexible printed circuit (FPC) 220 for signal input/output may be arranged.

Application Example 1

Figure 16:
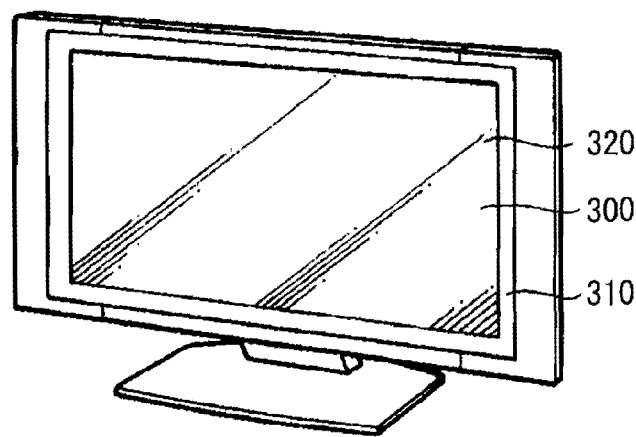
FIG. 16 is an external perspective view of an application example 1 of the display according to the foregoing respective embodiments.

FIG. 16 illustrates an appearance of a television to which the display according to the foregoing respective embodiments is applied. The television has, for example, a picture display screen section 300 including a front panel 310 and a filter glass 320. The picture display screen section 300 is composed of the display according to the foregoing respective embodiments.

Application Example 2

Figure 17A:
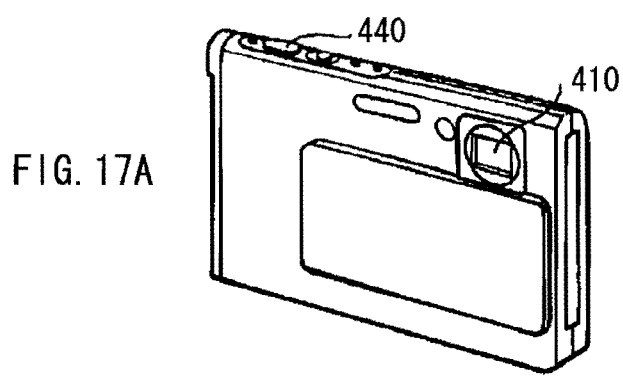
FIGS. 17A and 17B are an external perspective view from the front side of an application example 2 and an external perspective view from the back side of the application example 1, respectively.
Figure 17B:
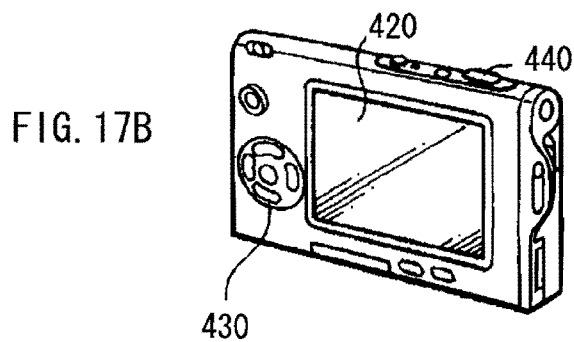

FIGS. 17A and 17B illustrate appearances of a digital camera to which the display according to the foregoing respective embodiments is applied. The digital camera has, for example, a light-emitting section for a flash 410, a display section 420, a menu switch 430, and a shutter button 440. The display section 420 is composed of the display according to the foregoing respective embodiments.

Application Example 3

Figure 18:
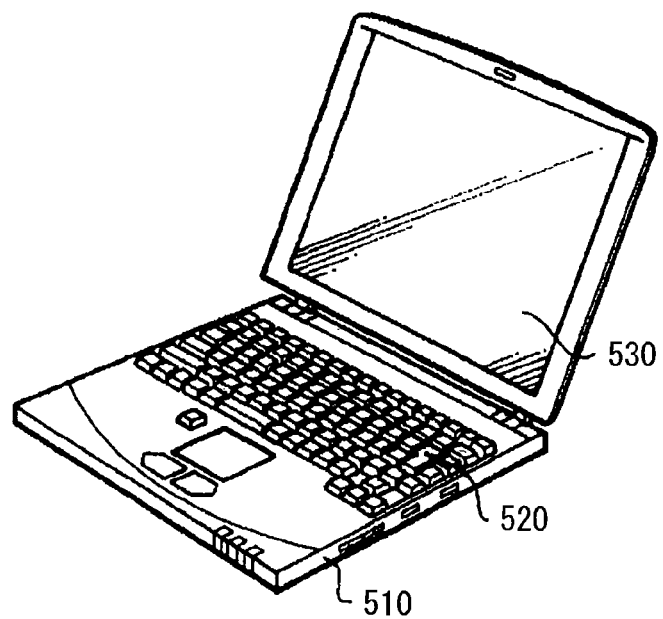
FIG. 18 is an external perspective view of an application example 3.

FIG. 18 illustrates an appearance of a notebook personal computer to which the display according to the foregoing respective embodiments is applied. The notebook personal computer has, for example, a main body 510, a keyboard 520 for operation of inputting characters and the like, a display section 530 for displaying an image. The display section 530 is composed of the display according to the foregoing respective embodiments.

Application Example 4

Figure 19:
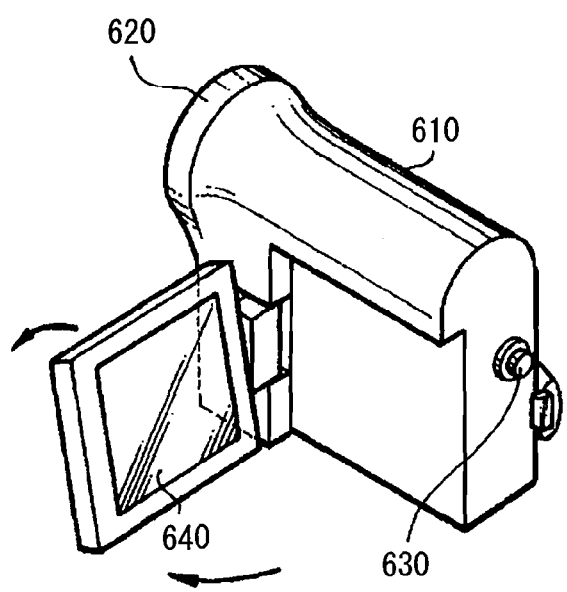
FIG. 19 is an external perspective view of an application example 4.
Figure 20:
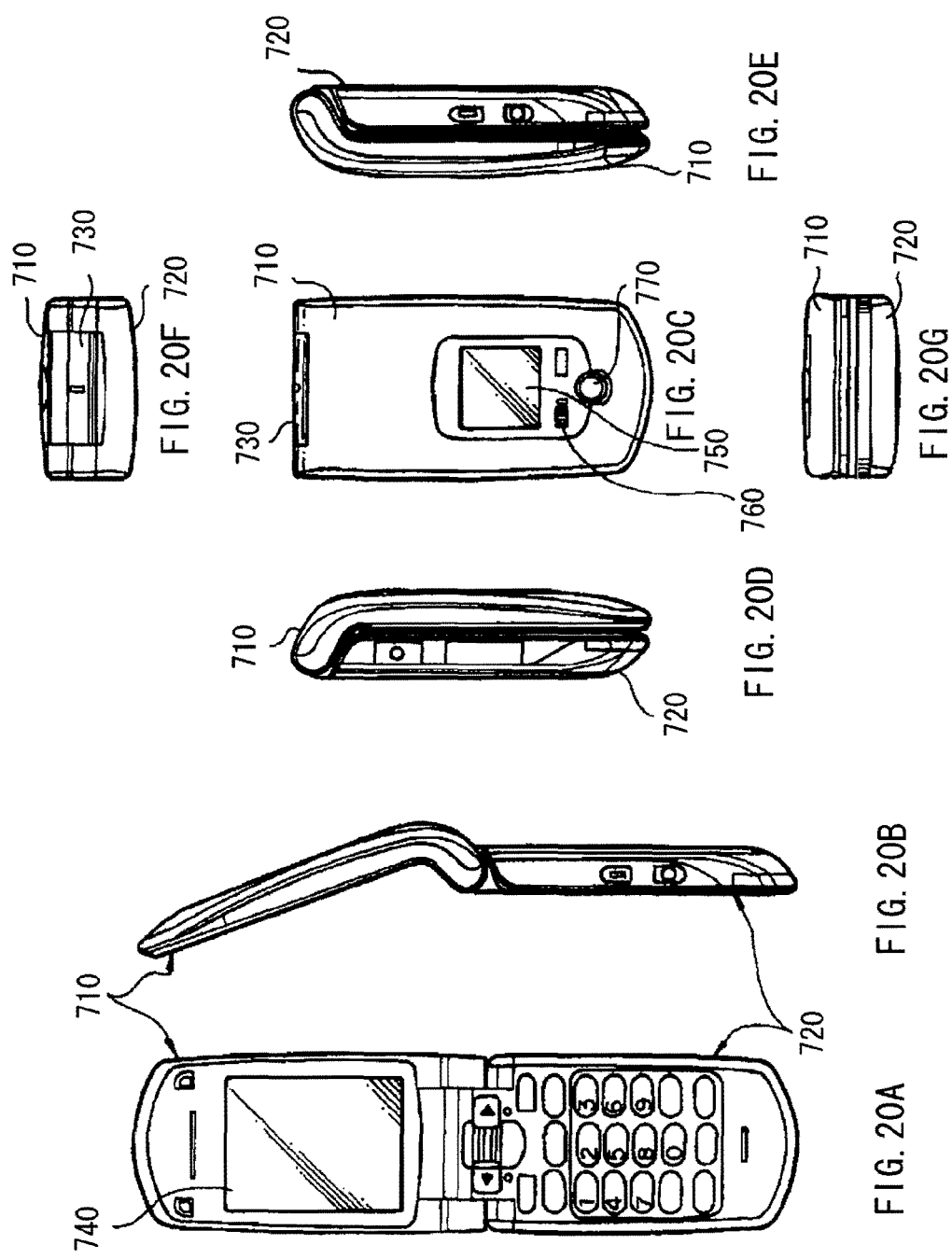
FIGS. 20A to 20G illustrate an application example 5.

FIG. 19 illustrates an appearance of a video camera to which the display according to the foregoing respective embodiments is applied. The video camera has, for example, a main body 610, a lens for shooting an object 620 arranged on a front surface of the main body 610, a shooting start/stop switch 630, and a display section 640. The display section 640 is composed of the display according to the foregoing respective embodiments.

Application Example 5

FIGS. 20A to 20G illustrate appearances of a cellular phone to which the display according to the foregoing respective embodiments is applied. The cellular phone is formed by connecting, for example, a top-side enclosure 710 and a bottom-side enclosure 720 to each other by a connection section (hinge section) 730. The cellular phone has a display 740, a sub-display 750, a picture light 760, and a camera 770. The display 740 or the sub-display 750 is composed of the display according to the foregoing respective embodiments.

Although the present invention is described referring to the embodiments, the invention is not limited to the above-described embodiments, and may be variously modified. For example, the material and thickness of each layer, the method and conditions of forming each layer are not limited to those described in the above-described embodiments, and each layer may be made of any other material with any other thickness by any other method under any other conditions. For example, the first light-absorbing layer 52B and the second light-absorbing layer 58 may be made of silicon carbide (SiC) in addition to amorphous silicon. Also in this case, the first insulating film 52A, the first light-absorbing layer 52B and the second insulating film 52C of the gate insulating film 52 are able to be formed successively.

In addition, in the above-described embodiments, the configuration of the pixel P1 of the liquid crystal display and the configurations of the organic light-emitting devices 60R, 60B and 60G are specifically described; however, all layers are not necessarily included, or any other layer may be further included.

Figure 21:
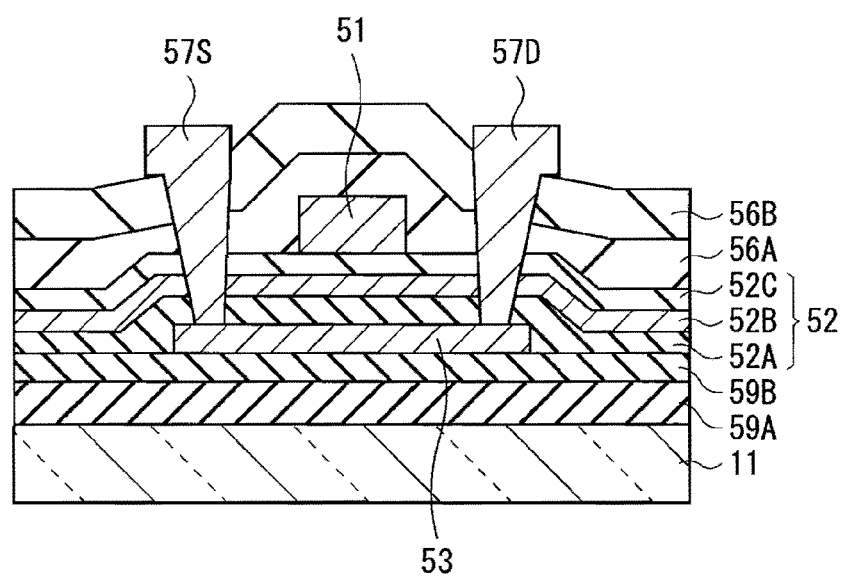
FIG. 21 is a sectional view of a modification of the TFT illustrated in FIG. 3.

Further, the present invention is applicable to a TFT with a top gate configuration as illustrated in FIG. 21. In this case, a silicon nitride (SiN) layer 59A and a silicon dioxide (SiO$_2$) layer 59B are formed on the glass substrate 11, and the active layer 53, the gate insulating film 52 and the gate electrode 51 are laminated in order thereon, and are covered with the interlayer insulating films 56A and 56B. Further, the source wiring 57S and the drain wiring 57D are connected to the active layer 53.

In addition, the present invention is applicable to the case where the active layer is made of silicon.

It should be understood by those skilled in the art that various modifications, combinations, sub-combinations and alterations may occur depending on design requirements and other factors insofar as they are within the scope of the appended claims or the equivalents thereof.

What is claimed is:

1. A thin film transistor comprising:
    a gate electrode;
    an active layer;
    a source electrode and a drain electrode on the active layer;
    a gate insulating film arranged between the gate electrode and the active layer, the gate insulating film including a first insulating film, a first light-absorbing layer and a second insulating film, the first insulating film being arranged in contact with the gate electrode, the first light-absorbing layer being arranged in contact with the first insulating film, and the second insulating film being arranged between the first light-absorbing layer and the active layer;
    an interlayer insulating film covering the gate electrode, the gate insulating film, the active layer, and the source and drain electrodes, the interlayer insulating film being arranged in contact with the source and drain electrodes; and
    a second light-absorbing layer arranged in contact with the interlayer insulating film,
    wherein,
        the second light-absorbing material (i) is made of the same material as a material of which the first light-absorbing layer is made and (ii) has the same thickness as a thickness of the first light-absorbing layer.

2. The thin film transistor according to claim 1, wherein the first insulating film and the second insulating film are made of at least one of silicon oxide and silicon nitride.

3. The thin film transistor according to claim 1, wherein:
    the first light-absorbing layer is made of a material absorbing light of 420 nm or less, and
    the first light-absorbing layer has a thickness of 10 nm to 100 nm both inclusive.

4. The thin film transistor according to claim 1, wherein the active layer is made of an oxide semiconductor.

5. The thin film transistor according to claim 3, wherein the active layer is made of an oxide semiconductor.

6. A display comprising a thin film transistor and a display device on a substrate, the thin film transistor including:
    a gate electrode;
    an active layer;
    a source electrode and a drain electrode on the active layer;
    a gate insulating film arranged between the gate electrode and the active layer, the gate insulating film including a first insulating film, a first light-absorbing layer and a second insulating film, the first insulating film being arranged in contact with the gate electrode, the first light-absorbing layer being arranged in contact with the first insulating film, and the second insulating film being arranged between the first light-absorbing layer and the active layer;
    an interlayer insulating film covering the gate electrode, the gate insulating film, the active layer, and the source and drain electrodes, the interlayer insulating film being arranged in contact with the source and drain electrodes; and
    a second light-absorbing layer arranged in contact with the interlayer insulating film, the second light-absorbing material (i) is made of the same material as a material of which the first light-absorbing layer is made and (ii) has the same thickness as a thickness of the first light-absorbing layer.

7. The thin film transistor according to claim 1, further comprising another interlayer insulating film that covers the second light-absorbing layer, and wherein the second light-absorbing layer is arranged in contact with the other interlayer insulating film.

* * * * *